United States Patent
Bae et al.

(10) Patent No.: US 10,923,174 B2
(45) Date of Patent: *Feb. 16, 2021

(54) ELECTRONIC DEVICE AND OPERATING METHOD THEREOF

(71) Applicant: SK hynix Inc., Gyeonggi-do (KR)

(72) Inventors: Sang-Geun Bae, Gyeonggi-do (KR); MinSoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/899,158

(22) Filed: Jun. 11, 2020

(65) Prior Publication Data

US 2020/0302990 A1  Sep. 24, 2020

Related U.S. Application Data

(63) Continuation of application No. 15/936,581, filed on Mar. 27, 2018, now Pat. No. 10,714,165.

(30) Foreign Application Priority Data

Sep. 8, 2017  (KR) .................. 10-2017-0115051

(51) Int. Cl.
*G11C 7/22* (2006.01)
*G11C 11/4074* (2006.01)
*G11C 11/4093* (2006.01)
*G11C 7/10* (2006.01)

(52) U.S. Cl.
CPC ........ *G11C 11/4074* (2013.01); *G11C 7/1084* (2013.01); *G11C 11/4093* (2013.01)

(58) Field of Classification Search
CPC ......... G11C 7/1078; G11C 7/22; G11C 16/28; G11C 16/10; G11C 16/32; G11C 7/1045; G11C 29/022; G11C 16/08; G11C 7/062; G11C 29/36; G11C 29/44
See application file for complete search history.

(56) References Cited

U.S. PATENT DOCUMENTS

2019/0080742 A1\* 3/2019 Bae ................... G11C 7/1084

\* cited by examiner

*Primary Examiner* — Hien N Nguyen
(74) *Attorney, Agent, or Firm* — IP & T Group LLP

(57) ABSTRACT

Provided is a semiconductor controller that includes: an input buffer for comparing a data signal received from the outside with a reference voltage and storing the data signal; and a reference voltage control unit for generating the reference voltage corresponding to a protocol condition of the received data signal set between a first protocol condition and a second protocol condition and providing the reference voltage to the input buffer.

14 Claims, 9 Drawing Sheets

ELECTRONIC DEVICE AND OPERATING
METHOD THEREOF

CROSS-REFERENCE TO RELATED
APPLICATION

This application is a continuation of U.S. patent application Ser. No. 15/936,581 filed on Mar. 27, 2018, which claims benefits of priority of Korean Patent Application No. 10-2017-0115051 filed on Sep. 8, 2017. The disclosure of each of the foregoing application is incorporated herein by reference in its entirety.

BACKGROUND

1. Field of Invention

Exemplary embodiments of the present disclosure relate to an electronic device. Particularly, exemplary embodiments relate to a semiconductor device and an operating method thereof.

2. Description of Related Art

A storage device is a device that stores data under the control of a host device such as a computer, a smart phone, or a smart pad. A storage device may include a semiconductor device for storing data and a controller for controlling the semiconductor device. When it comes to a memory device, it is generally classified into a volatile memory device and a nonvolatile memory device.

The volatile memory is a memory device which loses stored data when the power supply is cut off. Examples of the volatile memory are a static random access memory (SRAM), a dynamic RAM (DRAM), a synchronous DRAM (SDRAM), and the like.

The nonvolatile memory is a memory device which retains stored data even when the power supply is cut off. Examples of the nonvolatile memory are a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

Embodiments provide a semiconductor controller having improved scalability, a storage device including the semiconductor controller, and an operating method of the storage device.

According to an aspect of the present disclosure, there is provided a controller including: an input buffer for comparing a data signal received from the outside with a reference voltage and storing the data signal; and a reference voltage control unit for generating the reference voltage corresponding to a protocol condition of the received data signal set between a first protocol condition and a second protocol condition and providing the reference voltage to the input buffer.

According to an aspect of the present disclosure, there is provided a method for operating controller including: comparing a data signal received from the outside with a reference voltage and storing the data signal; and generating the reference voltage corresponding to a protocol condition of the received data signal set between a first protocol condition and a second protocol condition and provide the reference voltage to the input buffer.

According to an aspect of the present disclosure, there is provided an input buffer circuit including: a control circuit configured to receive a data signal and transfer the received data signal; a first input path configured to compare the transferred data signal with a first reference voltage to determine whether the data signal is in a logic high or low level under a first protocol condition; and a second input path configured to compare the transferred data signal with a second reference voltage to determine whether the data signal is in a logic high or low level under a second protocol condition.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
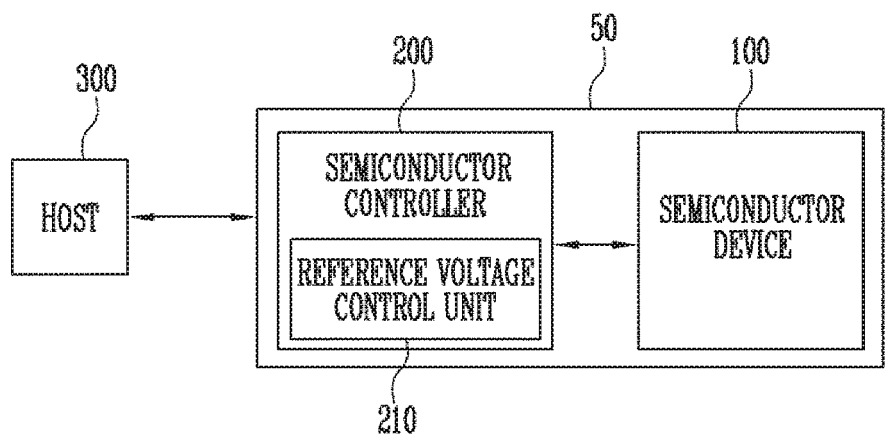
FIG. 1 is a diagram illustrating an electronic device according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating an electronic device according to an embodiment of the present disclosure.

Referring to FIG. 1, the electronic device 50 may include a semiconductor device 100 and a semiconductor controller 200. The electronic device 50 may be, e.g., a storage device according to one embodiment.

The semiconductor device 100 may be, e.g., a memory device that can store data according to one embodiment. The semiconductor device 100 operates in response to the control of the semiconductor controller 200. The semiconductor device 100 may include a plurality of memory cells that store data. In an embodiment, the semiconductor device 100 may be, e.g., a double data rate synchronous dynamic random access memory (DDR SDRAM), a low power double data rate 4 (LPDDR4) SDRAM, a graphics double data rate (DDDR) SRAM, a low power DDR (LPDDR), a rambus dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like.

The semiconductor controller 200 may output a data signal to the semiconductor device 100, or receive a data signal from the semiconductor device 100 or a host 300. Although FIG. 1 shows that the semiconductor controller 200 is included in the electronic device 50, it is for illustrative purposes only, and the semiconductor controller 200 may be provided separately or included in the host 30.

The data signal received by the semiconductor controller 200 may correspond to at least one of a command, an address, and data.

The semiconductor controller 200 may communicate with the semiconductor device 100 under an industry-set protocol condition.

For example, the semiconductor controller 200 may communicate with the semiconductor device 100 under a first protocol condition or communicate with the semiconductor device 100 under a second protocol condition. Here, each of the first protocol condition and the second protocol condition may be, for example, a protocol condition according to the DRAM semiconductor's operating speed and power consumption, which are provided in the JEDEC Standards. In an embodiment, the first protocol condition may be, for example, a double data rate fourth-generation synchronous dynamic random-access memory (DDR4), and the second protocol condition may be, for example, a low power double data rate 4 SDRAM (LPDDR4). However, these exemplary protocols are listed for ease of description, and the first protocol condition and the second protocol condition are not limited thereto.

The semiconductor controller 200 may further include a reference voltage control unit 210.

The reference voltage control unit 210 may generate a reference voltage to be compared with the voltage level of a data signal received by the semiconductor controller 200. In an embodiment, the reference to voltage control unit 210 may generate different reference voltages under the first protocol condition and the second protocol condition. For example, when the first protocol condition is DDR4, the reference voltage may have a voltage level corresponding to either one of a first range and a second range. Alternatively, when the second protocol condition is LPDDR4, the reference voltage has a voltage level corresponding to either one of a third range and a fourth range. In an embodiment, the first to fourth ranges may be voltage level ranges defined under protocol conditions provided in the JEDEC Standards.

The host 300 may communicate with the electronic device 50, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), and the like.

Figure 2:
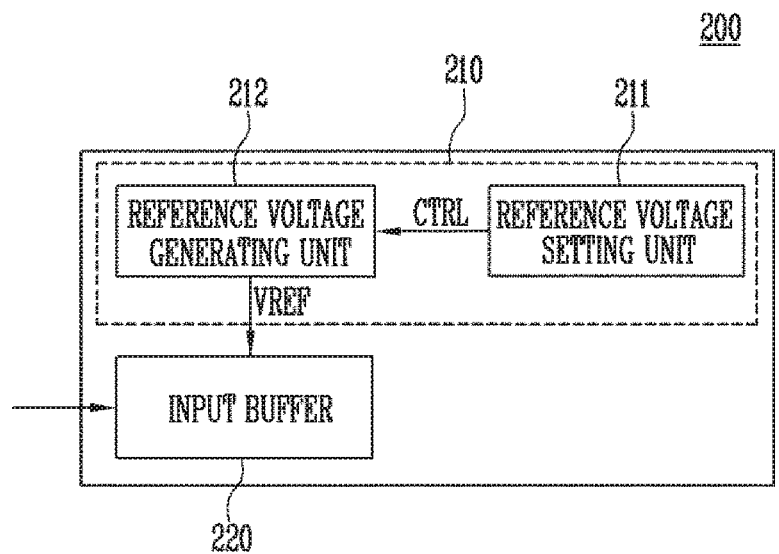
FIG. 2 is a block diagram illustrating an exemplary configuration of a semiconductor controller of FIG. 1.

FIG. 2 is a block diagram illustrating an exemplary configuration of the semiconductor controller 200 of FIG. 1.

Referring to FIG. 2, the semiconductor controller 200 may include a reference voltage control unit 210 and an input buffer 220.

The reference voltage control unit 210 may include a reference voltage setting unit 211 and a reference voltage generating unit 212.

The reference voltage setting unit 211 may generate a control signal CTRL for controlling the reference voltage generating unit 212 under a communication protocol condition with the semiconductor device 100 described with reference to FIG. 1 to generate a reference voltage corresponding to the current communication protocol condition.

In an embodiment, the control signal CTRL generated by the reference voltage setting unit 211 may correspond to any one of a first mode control signal corresponding to the first range in the voltage level range defined under the first protocol condition, a second mode control signal corresponding to the second range in the voltage level range defined under the first protocol condition, a third mode control signal corresponding to the third range in the voltage level range defined under the second protocol condition, and a fourth mode control signal correspond to the fourth range in the voltage level range defined under the second protocol condition.

The reference voltage generating unit 212, in response to any one of the first to fourth mode control signals received from the reference voltage setting unit 211, may generate a reference voltage VREF having a voltage level that falls in the range corresponding to the received control signal. The reference voltage generating unit 212 may provide the generated reference voltage VREF to the input buffer 220.

The input buffer 220 may receive the reference voltage VREF provided from the reference voltage generating unit 212, compare the reference voltage VREF with a data signal input from the outside, and store the data signal as a digital signal of "0" or "1."

Figure 3:
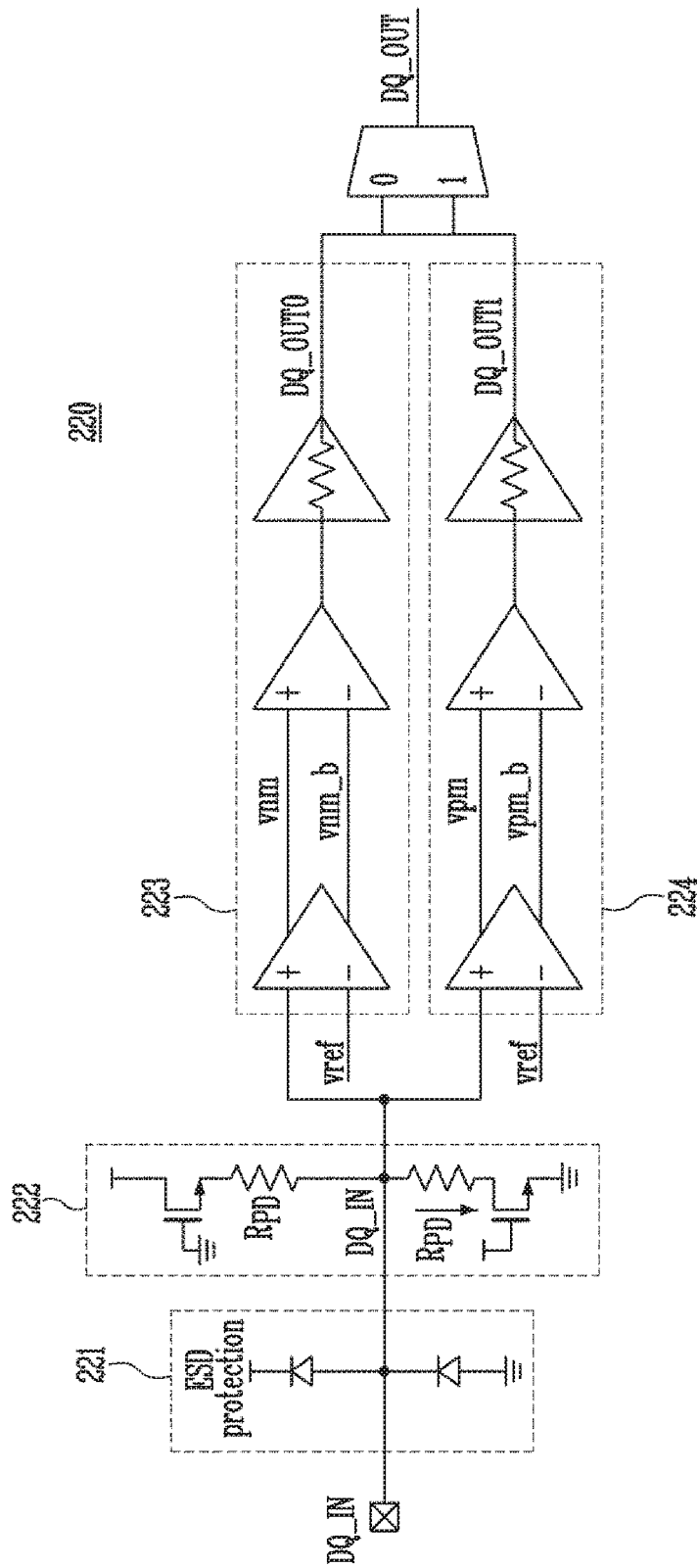
FIG. 3 is a circuit diagram illustrating an exemplary configuration of an input buffer of FIG. 2.

FIG. 3 is a circuit diagram illustrating an exemplary configuration of the input buffer 220 of FIG. 2.

Referring to FIG. 3, the input buffer 220 may include an electrostatic discharge protection circuit 221, a pull-up/pull-down control unit 222, a first input path 223, and a second input path 224.

The input buffer 220 receives a data signal from the outside through an input terminal DQ_IN.

The received data signal is input to the pull-up/pull-down control unit 222 via the electrostatic discharge protection circuit 221. The pull-up/pull-down control unit 222 may provide the input data signal to the first input path 223 or the second input path 224 by increasing or decreasing the voltage level of the data signal.

When the semiconductor controller 200 performs data communication under the first protocol condition, the semiconductor controller 200 may input the data signal along the first input path 223. When the semiconductor controller 200 performs data communication under the second protocol condition, the semiconductor controller 200 may input the data signal along the second input path 224.

A reference voltage Vref provided to the first input path 223 may be a reference voltage having a voltage level corresponding to either one of the first range and the second range of the first protocol condition generated by the reference voltage setting unit 211 described with reference to FIG. 2. A reference voltage Vref provided to the second input path 224 may be a reference voltage having a voltage level corresponding to either one of the third range and the fourth range of the second protocol condition generated by the reference voltage setting unit 211 described with reference to FIG. 2.

Figure 4:
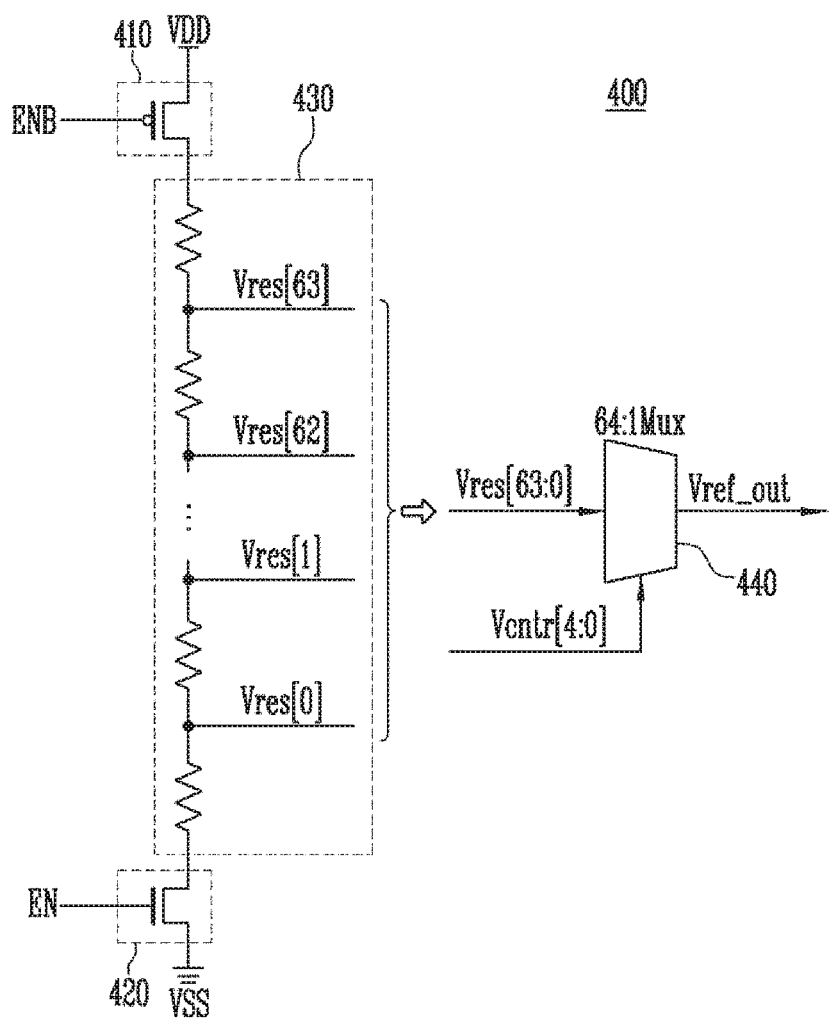
FIG. 4 is a circuit diagram illustrating an exemplary configuration of a reference voltage generating unit according to one embodiment.

FIG. 4 is a circuit diagram illustrating an exemplary configuration of a reference voltage generating unit 400 according to one embodiment.

Referring to FIG. 4, the reference voltage generating unit 400 may include a first switch 410, a second switch 420, and a ladder resistor 430. The reference voltage generating unit 400 may generate reference voltages Vres[0] to Vres[63] having various levels by dividing a power voltage VDD in a voltage dividing manner, using the ladder resistor 430 coupled between the power voltage VDD and a ground voltage VSS, when the first switch 410 and the second switch 420 are in a turn-on state.

The first switch 410 may be configured with an NMOS (or PMOS) transistor, for instance. An inverse enable signal ENB may be input to the gate electrode of the first switch 410. The power voltage VDD may be applied to the drain electrode of the first switch 410.

The second switch 420 may be configured with a PMOS (or NMOS) transistor, for instance. The source electrode of the second switch 420 may be coupled to the ground voltage VSS.

The ladder resistor 430 may include a plurality of resistors. Although FIG. 4 shows ladder resistor 430 having 64 resistors, the present disclosure is not limited thereto, and any suitable number of resistors may be included in the ladder resistor 430 according to various embodiments.

The ladder resistor 430 outputs, through nodes between the plurality of resistors, a plurality of reference voltages Vres[0] to Vres[63] obtained by dividing the power voltage VDD according to resistance values of unit resistors. In an embodiment, the resistance values of the unit resistors included in the ladder resistor 430 may be equal to or different from one another.

The ladder resistor 430 may output, to a multiplexer 440, the reference voltages Vres[0] to Vres[63] having 64 voltage levels different from one another, which are output through the nodes between the plurality of resistors.

The multiplexer 440 may output any one reference voltage as an output reference voltage Vref_out according to a control signal Vcntr[4:0] input thereto. The output reference voltage Vref_out may be the reference voltage Vref input to the input buffer 220 described with reference to FIG. 3.

When the electronic device 50 operates under one protocol condition, the electronic device 50 may operate using the reference voltage generating unit 400 according to the embodiment of FIG. 4. However, multiple multiplexers 440 or multiple ladder resistors 430 may be used so as to generate a reference voltage that satisfies a plurality of protocol conditions.

Figure 5:
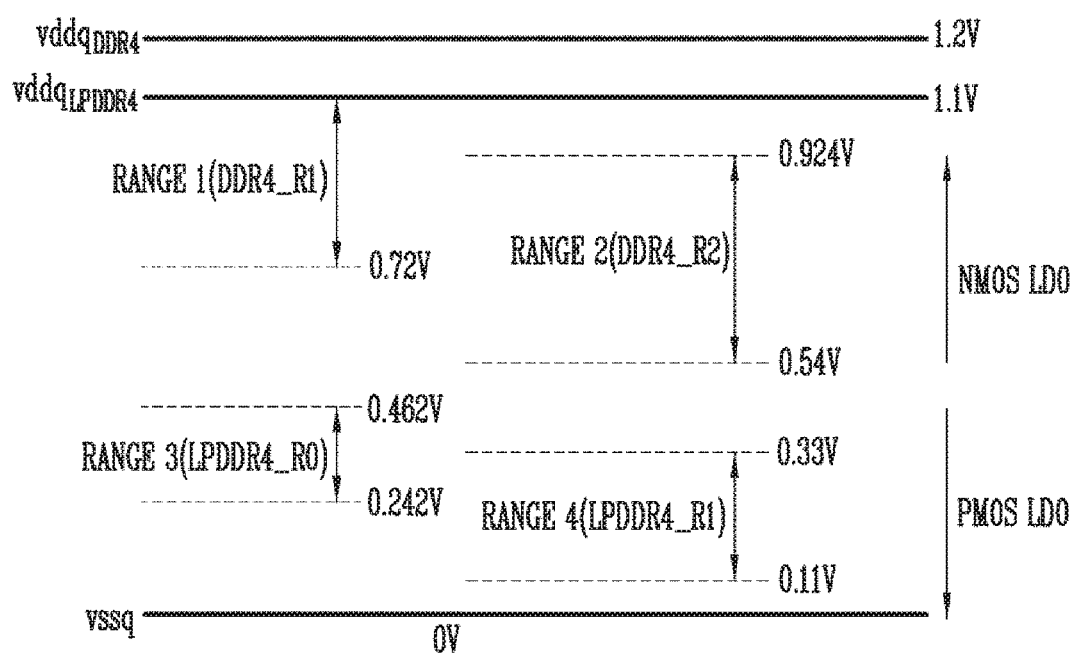
FIG. 5 is a diagram illustrating voltage level ranges of a reference voltage under different protocol conditions.

FIG. 5 is a diagram illustrating voltage level ranges of a reference voltage under different protocol conditions.

Referring to FIG. 5, the semiconductor controller may communicate with the semiconductor device under any one of several protocol conditions.

For example, the semiconductor controller may communicate with the semiconductor device under a first protocol condition or communicate with the semiconductor device under a second protocol condition. In FIG. 5, it is assumed that the first protocol condition is DDR4, and the second protocol condition is LPDDR4, for instance. However, this is for ease of description, and the first protocol condition and the second protocol condition are not limited thereto.

The first protocol condition may use a reference voltage having a voltage level corresponding to either one of a first range and a second range according to an operation mode thereof.

The second protocol condition uses a reference voltage having a voltage level corresponding to either one of a third range and a fourth range according to an operation mode thereof.

A power voltage in the first protocol condition may be, e.g., 1.2 V, and a power voltage in the second protocol condition may be, e.g., 1.1 V.

The reference voltage used when the semiconductor controller communicates with the semiconductor device under the first protocol condition may have a voltage level corresponding to either one of a first range RANGE1 (DDR4_R1) and a second range RANGE2 (DDR4_R2). In an embodiment, the voltage level of the first range RANGE1 (DDR4_R1) may be, e.g., larger than 0.72 V and smaller than 1.1 V. The voltage level of the second range RANGE2 (DDR4_R2) may be, e.g., larger than 0.54 V and smaller than 0.924 V.

The reference voltage used when the semiconductor controller communicates with the semiconductor device under the second protocol condition may have a voltage level corresponding to either one of a third range RANGE3 (LPDDR4_R0) and a fourth range RANGE4 (LPDDR4_R1). In an embodiment, the voltage level of the third range RANGE3 (LPDDR4_R0) may be, e.g., larger than 0.242 V and smaller than 0.462 V. The voltage level of the fourth range RANGE4 (LPDDR4_R1) may be, e.g., larger than 0.11 V and smaller than 0.33 V.

According to an embodiment of the present disclosure, the semiconductor controller may generate a reference voltage that satisfies different protocol conditions. For example, the reference voltage generating unit included in the semiconductor controller may generate a reference voltage that satisfies the first protocol condition or a reference voltage that satisfies the second protocol condition. The reference voltage generating unit may include, e.g., two low drop out (LDO) regulators. In accordance with one exemplary embodiment, an LDO regulator using an NMOS transistor (NMOS LDO) is used under the first protocol condition in which the reference voltage having a relatively high voltage level is used, and an LDO regulator using a PMOS transistor (PMOS LDO) is used under the second protocol condition in which the reference voltage having a relatively low voltage level is used.

Figure 6:
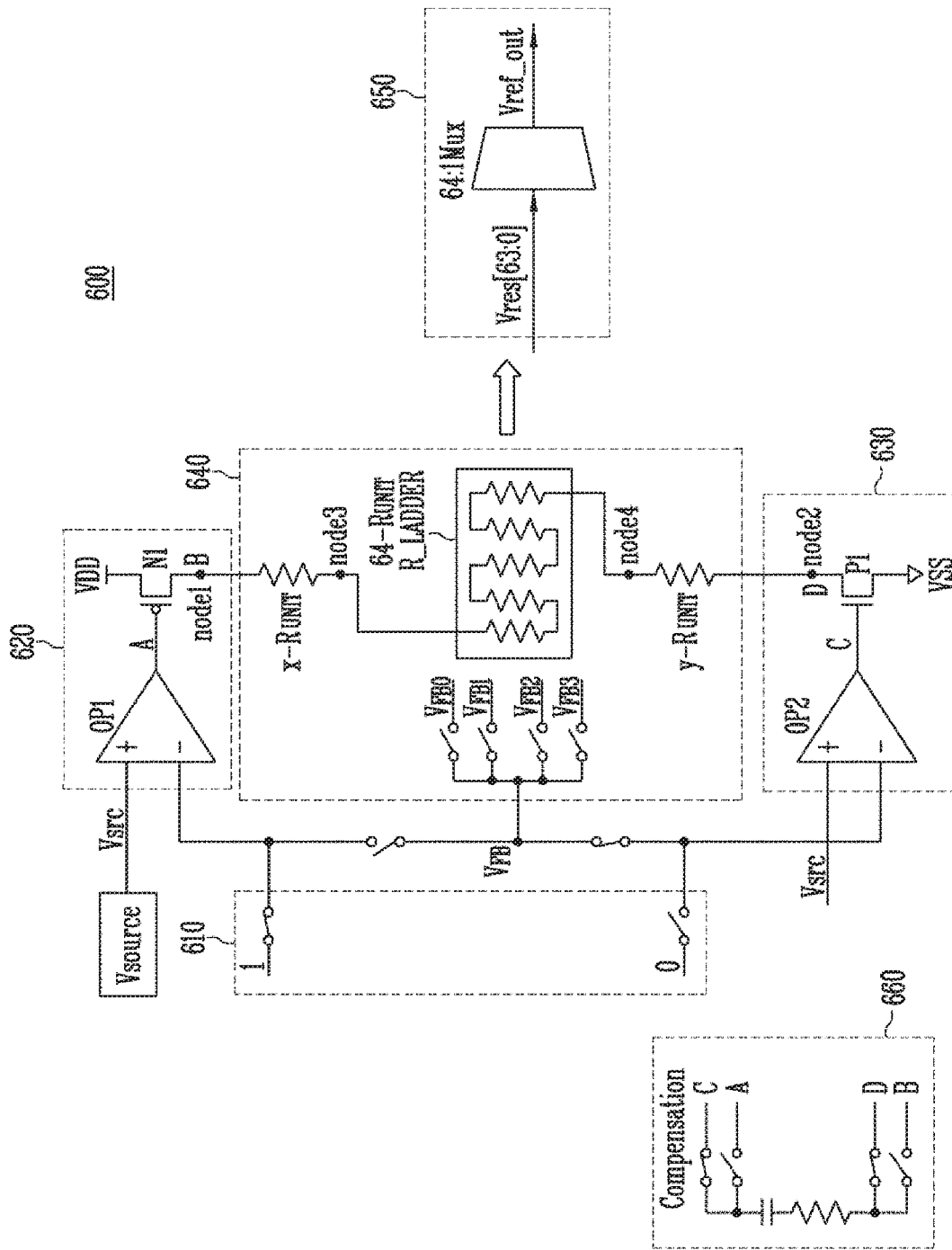
FIG. 6 is a circuit diagram illustrating a reference voltage generating unit according to an embodiment of the present disclosure.

FIG. 6 is an exemplary circuit diagram illustrating a reference voltage generating unit according to an embodiment of the present disclosure.

Referring to FIG. 6, the reference voltage generating unit 600 may include an operation setting unit 610, a first driving unit 620, a second driving unit 630, a voltage generating unit 640, and a multiplexer 650.

The operation setting unit 610 may set a signal input to the first driving unit 620 and the second driving unit 630 according to an operation mode. In an embodiment, the operation mode may be a mode corresponding to either one of the first protocol condition and the second protocol condition, which are described with reference to FIG. 5. For example, the operation mode may correspond to any one of a first mode for generating a reference voltage corresponding to the first range in the voltage level range defined under the first protocol condition, a second mode for generating a reference voltage corresponding to the second range in the voltage level range defined under the first protocol condition, a third mode for generating a reference voltage corresponding to the third range in the voltage level range defined under the second protocol condition, and a fourth mode for generating a reference voltage correspond to the fourth range in the voltage level range defined under the second protocol condition.

The operation setting unit 610 may allow any one of the first driving unit 620 and the second driving unit 630 to be driven according to the control signal output from the reference voltage setting unit 211 described in the embodiment of FIG. 2. The control signal received by the operation setting unit 610 may correspond to any one of a first mode control signal corresponding to the first range in the voltage level range defined under the first protocol condition, a second mode control signal corresponding to the second range in the voltage level range defined under the first protocol condition, a third mode control signal corresponding to the third range in the voltage level range defined under the second protocol condition, and a fourth mode control signal correspond to the fourth range in the voltage level range defined under the second protocol condition.

Although not shown in the drawing, the operation setting unit 610, the first driving unit 620, the second driving unit 630, the voltage generating unit 640, and the multiplexer 650 may be controlled according to the first to fourth mode control signals.

The first driving unit 620 may include a first operational amplifier OP1 and a first switch N1.

The first operational amplifier OP1 may receive a source voltage Vsrc input to a non-inverting terminal thereof, and receive either one of a driving signal and a feedback voltage, which is input to an inverting terminal thereof. The first operational amplifier OP1 may output a signal corresponding to a voltage difference between signals input through the inverting terminal and the non-inverting terminal.

The first switch N1 may be configured, e.g., with an NMOS (or PMOS) transistor. The first switch N1 may be turned on in response to an output of the first operational amplifier OP1, which is input to the gate electrode thereof. The drain electrode of the first switch N1 may be coupled to a power voltage VDD, and the source electrode of the first switch N1 may be coupled to a first node node1.

In an embodiment, the first driving unit 620 may transfer the power voltage VDD to the first node node1 in response to the first mode control signal or the second mode control signal. Alternatively, the first driving unit 620 may provide the first node node1 with a second voltage V2 that is lower than the power voltage VDD and is higher than a ground voltage VSS in response to the third mode control signal or the fourth mode control signal.

The second driving unit 630 may include a second operational amplifier OP2 and a second switch P1.

The second operational amplifier OP2 may receive a source voltage Vsrc input to a non-inverting terminal thereof, and receive either one of a driving signal and a feedback voltage $V_{FB}$, which is input to an inverting terminal thereof. The second operational amplifier OP2 may output a signal corresponding to a voltage difference between signals input through the inverting terminal and the non-inverting terminal.

The second switch P1 may be configured, e.g., with a PMOS (or NMOS) transistor. The second switch P1 may be turned on in response to an output of the second operational amplifier OP2, which is input to the gate electrode thereof. The second switch P1 may be coupled between a second node node2 and the ground voltage VSS.

The second driving unit 630 may provide the second node node2 with a first voltage V1 that is higher than the ground voltage VSS and is lower than the power voltage VDD in response to the first mode control signal or the second mode control signal. Alternatively, the second driving unit 630 may provide the ground voltage VSS to the second node node2 in response to the third mode control signal or the fourth mode control signal.

The voltage generating unit 640 may include a first dividing resistor x-$R_{UNIT}$, a second dividing resistor y-$R_{UNIT}$, and a ladder resistor 64-$R_{UNIT}$ R_LADDER.

The first dividing resistor x-$R_{UNIT}$ may be a variable resistor coupled between the first node node1 and the ladder resistor 64-$R_{UNIT}$ R_LADDER. The first dividing resistor x-$R_{UNIT}$ may have at least one unit resistance value according to operation modes.

The second dividing resistor y-$R_{UNIT}$ may be a variable resistor coupled between the ladder resistor 64-$R_{UNIT}$ R_LADDER and the fourth node node4. The second dividing resistor y-$R_{UNIT}$ may have at least one unit resistance value according to operation modes.

The first dividing resistor x-$R_{UNIT}$ and the second dividing resistor y-$R_{UNIT}$ may be controlled to have at least one preset unit resistance value according to the first to fourth mode control signals.

The ladder resistor 64-$R_{UNIT}$ R_LADDER may be coupled between the first dividing resistor x-$R_{UNIT}$ and the second dividing resistor y-$R_{UNIT}$.

The ladder resistor 64-$R_{UNIT}$ R_LADDER may generate a plurality of reference voltages Vres[63:0] by dividing, in a voltage dividing manner, the difference between the voltage of a third node node3 and the voltage of a fourth node node4, which are determined according to unit resistance values of the first dividing resistor x-$R_{UNIT}$ and the second dividing resistor y-$R_{UNIT}$, which are changed depending on a set operation mode.

In an embodiment, the ladder resistor 64-$R_{UNIT}$ R_LADDER may provide feedback voltages $V_{FB}$ having different voltage levels to either one of the first driving unit 620 and the second driving unit 630 according to the first to fourth mode control signals.

The multiplexer 650 may receive a plurality of reference voltages Vres[63:0] output from nodes between the plurality of resistors included in the ladder resistor 64-$R_{UNIT}$ R_LADDER, and output, as an output reference voltage vres_out, any one reference voltage among the plurality of reference voltages Vres[63:0].

In an embodiment, the reference voltage generating unit 600 of FIG. 6 may be configured in a form in which an NMOS LDO regulator based on the first driving unit 620 and a PMOS LDO regulator based on the second driving unit 630 are coupled to each other in the entire circuit configuration thereof.

Since the LDO regulator has a feedback structure, a phase margin can be secured through compensation 660. The reference voltage generating unit 600 according to the embodiment of the present disclosure may include two feedback loops as a rule, and hence two compensation resistors and two capacitors may be required. However, the first driving unit 620 and the second driving unit 630 may not simultaneously operate according to one embodiment, but only either one of the first driving unit 620 and the second driving unit 630 may operate. Thus, one compensation resistor and one capacitor can be shared in this embodiment. Accordingly, the area of the entire circuit can be reduced.

Hereinafter, an exemplary operation of the reference voltage generating unit 600 of FIG. 6 will be described in detail with reference to FIGS. 7 to 10.

In the embodiment of FIGS. 7 to 10, the number of unit resistors included in the first dividing resistor x-$R_{UNIT}$ and the second dividing resistor y-$R_{UNIT}$, which are described with reference to FIG. 6, may be, e.g., a total of 77 (x+y=77), and the 77 unit resistors may be differently divided in the first dividing resistor x-$R_{UNIT}$ and the second dividing resistor y-$R_{UNIT}$ according to operation modes. In addition, the number of unit resistors included in the ladder resistor may be, e.g., 64. Thus, the number of unit resistors included in the reference voltage generating unit may be, e.g., a total of 141 (x+64+y=141). However, this is for ease of description, and the number of resistors included in the reference voltage generating unit according to the embodiment of the present disclosure is not limited thereto.

Figure 7:
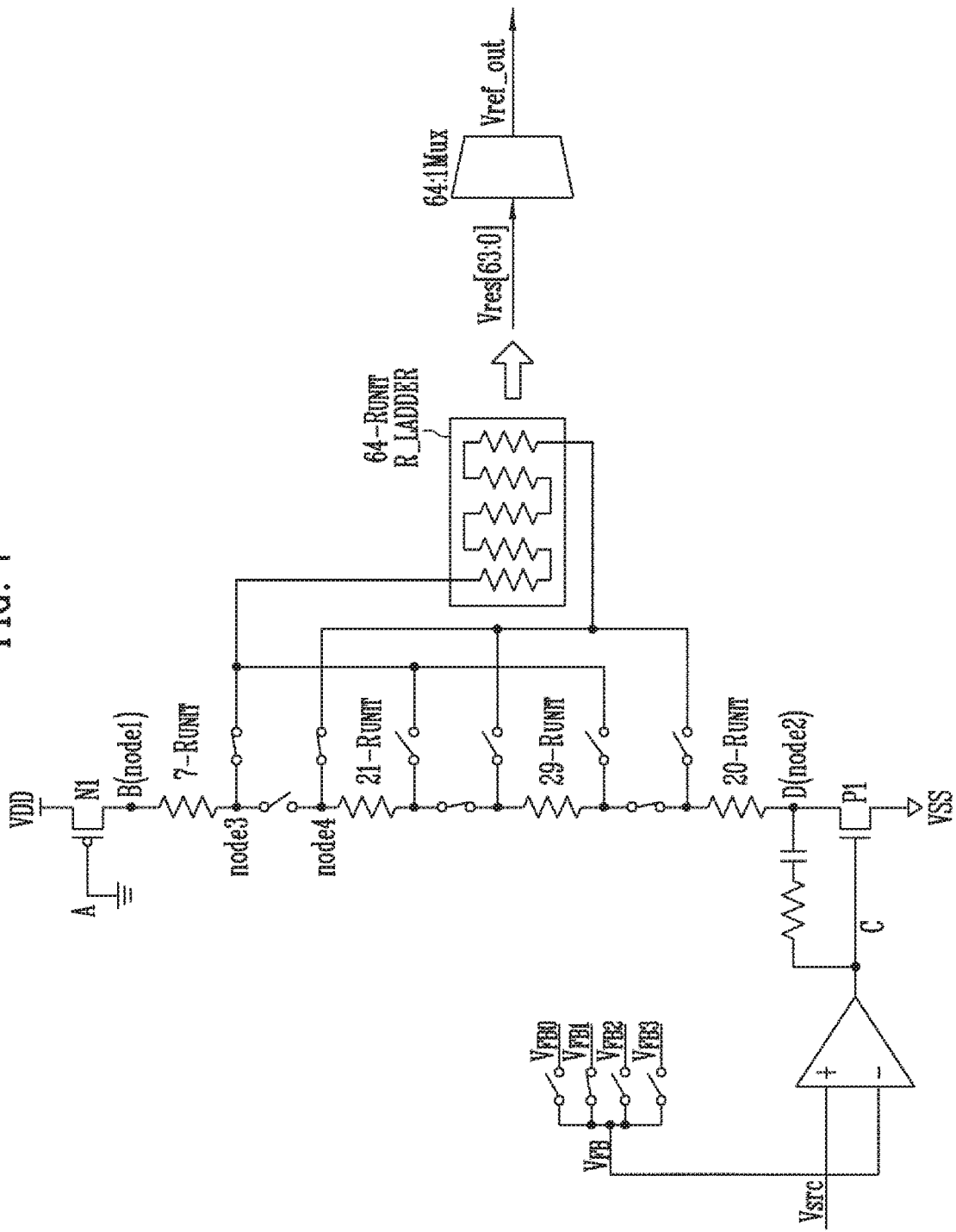
FIG. 7 is a diagram illustrating an exemplary operation of the reference voltage generating unit that generates a reference voltage under a first range of a first protocol condition.

FIG. 7 is a diagram illustrating an exemplary operation of the reference voltage generating unit that generates a reference voltage under the first range of the first protocol condition.

Referring to FIGS. 6 and 7, the first mode control signal may be input to generate a reference voltage under the first range of the first protocol condition. The first driving unit 620 may transfer the power voltage VDD to the first node node1 according to the first mode control signal. Specifically, a driving signal corresponding to "1" may be input to the inverting terminal of the first operational amplifier OP1 such that the output of the first operational amplifier OP1 becomes "0."

In addition, the second driving unit 630 may receive feedback voltage 1 $V_{FB1}$ input from the ladder resistor 64-$R_{UNIT}$ R_LADDER, and the feedback voltage 1 $V_{FB1}$ may be input to the inverting terminal of the second operational amplifier OP2. The feedback voltage 1 $V_{FB1}$ is controlled to be equal to the source voltage Vsrc input to the non-inverting terminal of the second operational amplifier OP2, so that a negative feedback is applied to the second operational amplifier OP2. The second driving unit 630 may provide the second node node2 with the first voltage V1 that is higher than the ground voltage VSS and is lower than the power voltage VDD.

Thus, the voltage of the first node node1 is the power voltage VDD, and the voltage of the second node node2 is the first voltage V1.

The ladder resistor 64-$R_{UNIT}$ R_LADDER and the multiplexer 650 are coupled to each other, and the number of unit resistors included in the first dividing resistor x-$R_{UNIT}$ at the upper side of the ladder resistor 64-$R_{UNIT}$ R_LADDER and the second dividing resistor y-$R_{UNIT}$ at the lower side of the ladder resistor 64-$R_{UNIT}$ R_LADDER may be adjusted according to the first mode control signal.

According to the first mode control signal, the first dividing resistor x-$R_{UNIT}$ has resistance values corresponding to 7 unit resistors. The second dividing resistor y-$R_{UNIT}$ has resistance values corresponding to 70 unit resistors (21+29+20). The ladder resistor 64-$R_{UNIT}$ R_LADDER may generate a plurality of reference voltages Vres[63:0] by dividing, in a voltage dividing manner, the difference between the voltage of the third node node3 and the voltage of the fourth node node4, which are determined by the first dividing resistor x-$R_{UNIT}$ having the resistance values corresponding to 7 unit resistors and the second dividing resistor y-$R_{UNIT}$ having the resistance values corresponding to 70 unit resistors.

Figure 8:
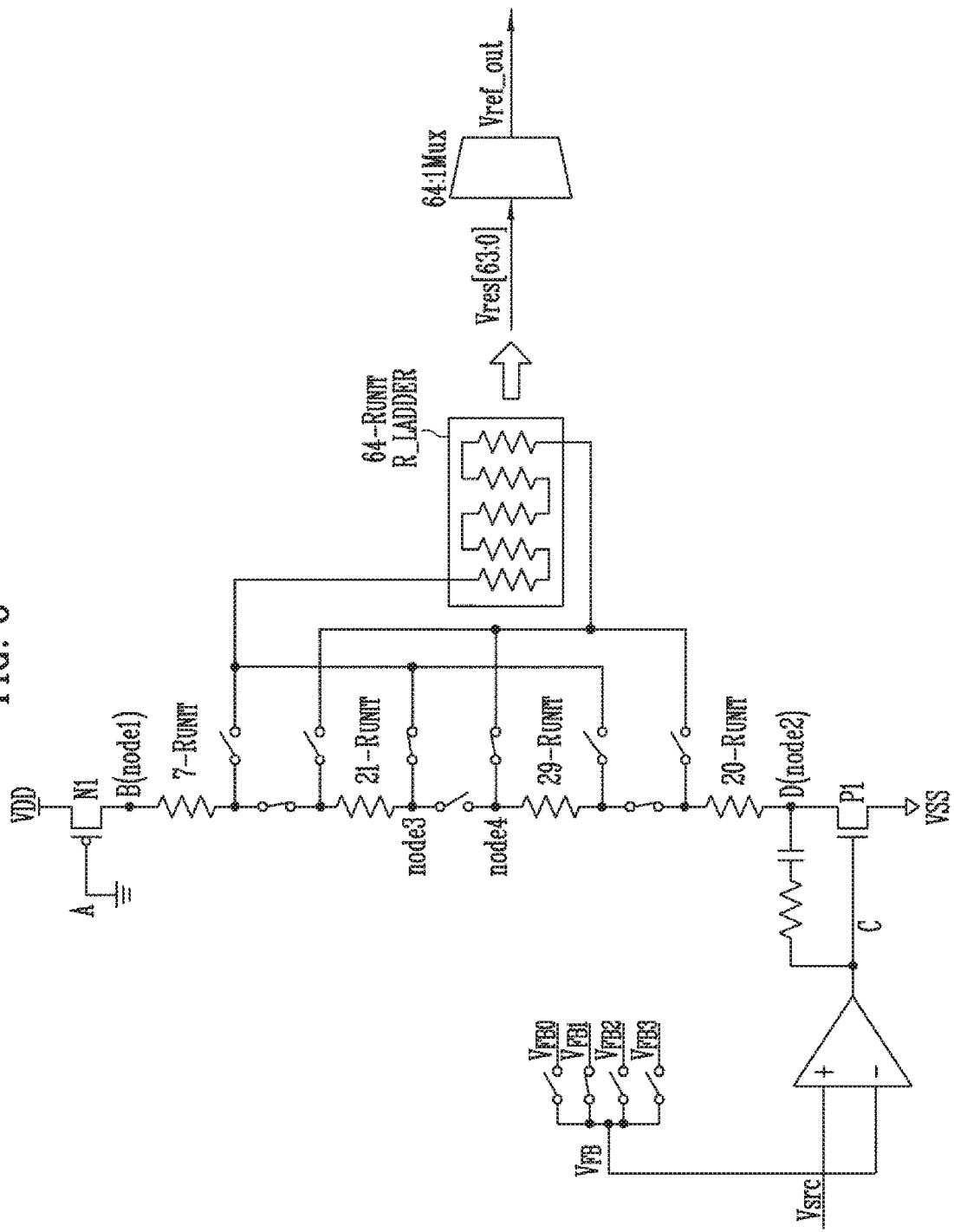
FIG. 8 is a diagram illustrating an exemplary operation of the reference voltage generating unit that generates a reference voltage under a second range of the first protocol condition.

FIG. 8 is a diagram illustrating an exemplary operation of the reference voltage generating unit that generates a reference voltage under the second range of the first protocol condition.

Referring to FIGS. 6 and 8, the second mode control signal may be input to generate a reference voltage under the second range of the first protocol condition. The first driving unit 620 may transfer the power voltage VDD to the first node node1 according to the second mode control signal. Specifically, a driving signal corresponding to "1" may be input to the inverting terminal of the first operational amplifier OP1 such that the output of the first operational amplifier OP1 becomes "0."

In addition, the second driving unit 630 may receive feedback voltage 3 $V_{FB3}$ input from the ladder resistor 64-$R_{UNIT}$ R_LADDER, and the feedback voltage 3 $V_{FB3}$ may be input to the inverting terminal of the second operational amplifier OP2. The feedback voltage 3 $V_{FB3}$ is controlled to be equal to the source voltage Vsrc input to the non-inverting terminal of the second operational amplifier OP2, so that a negative feedback is applied to the second operational amplifier OP2. The second driving unit 630 may provide the second node node2 with the first voltage V1 that is higher than the ground voltage VSS and is lower than the power voltage VDD.

Thus, the voltage of the first node node1 is the power voltage VDD, and the voltage of the second node node2 is the first voltage V1.

The ladder resistor 64-$R_{UNIT}$ R_LADDER and the multiplexer 650 are coupled to each other, and the number of unit resistors included in the first dividing resistor x-$R_{UNIT}$ at the upper side of the ladder resistor $R_{UNIT}$ R_LADDER and the second dividing resistor y-$R_{UNIT}$ at the lower side of the ladder resistor 64-$R_{UNIT}$ R_LADDER may be adjusted according to the second mode control signal.

According to the second mode control signal, the first dividing resistor x-$R_{UNIT}$ has resistance values corresponding to 28 unit resistors. The second dividing resistor y-$R_{UNIT}$ has resistance values corresponding to 49 unit resistors (29+20). The ladder resistor 64-$R_{UNIT}$ R_LADDER may generate a plurality of reference voltages Vres[63:0] by dividing, in a voltage dividing manner, the difference between the voltage of the third node node3 and the voltage of the fourth node node4, which are determined by the first dividing resistor x-$R_{UNIT}$ having the resistance values corresponding to 28 unit resistors and the second dividing resistor y-$R_{UNIT}$ having the resistance values corresponding to 49 unit resistors.

Figure 9:
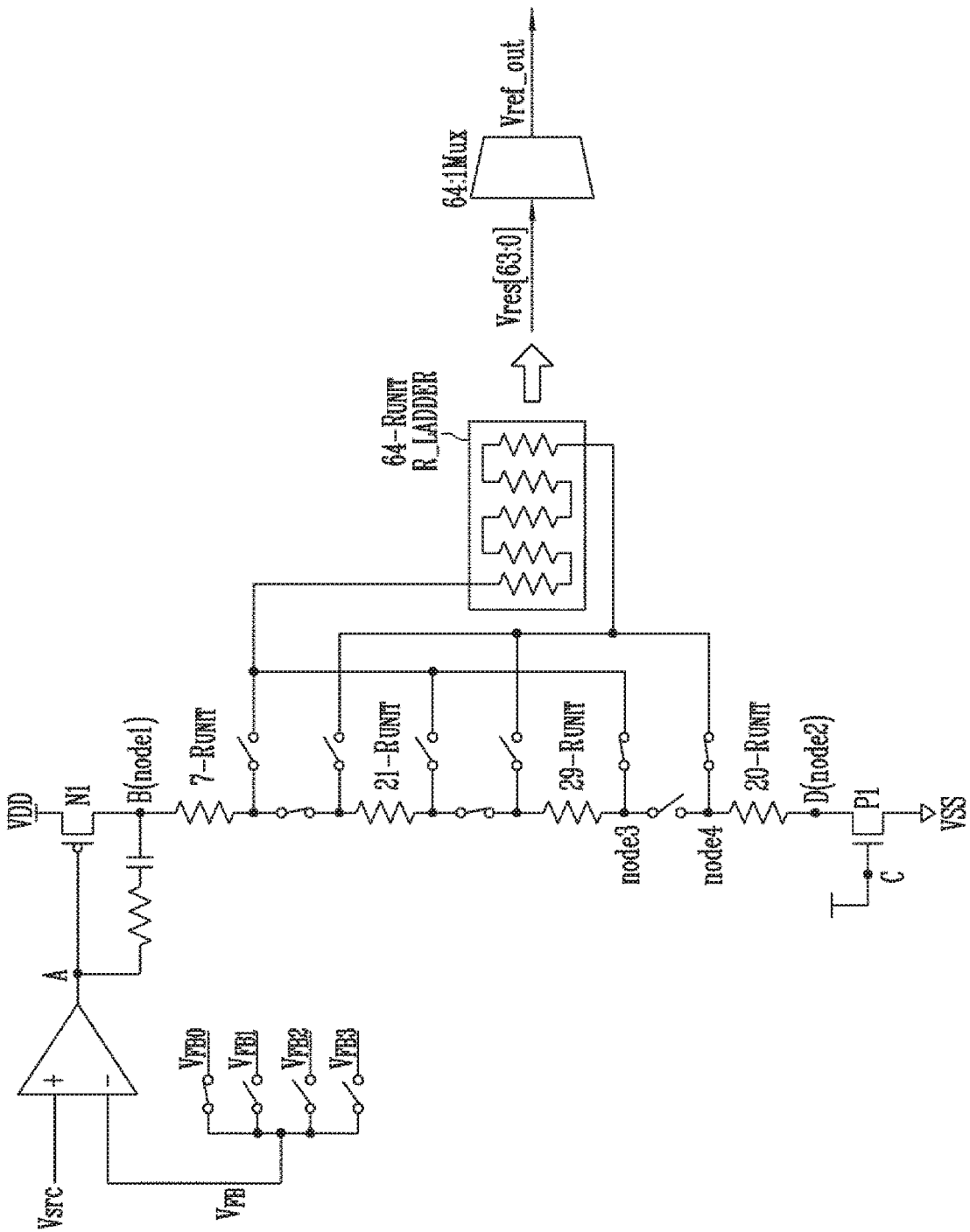
FIG. 9 is a diagram illustrating an exemplary operation of the reference voltage generating unit that generates a reference voltage under a third range of a second protocol condition.

FIG. 9 is a diagram illustrating an exemplary operation of the reference voltage generating unit that generates a reference voltage under the third range of the second protocol condition.

Referring to FIGS. 6 and 9, the third mode control signal may be input to generate a reference voltage under the third range of the second protocol condition. The second driving unit 630 may transfer the ground voltage VSS to the second node node2 according to the third mode control signal. Specifically, a driving signal corresponding to "0" may be input to the inverting terminal of the second operational amplifier OP2 such that the output of the second operational amplifier OP2 becomes "1."

In addition, the first driving unit 620 may receive feedback voltage 0 $V_{FB0}$ input from the ladder resistor 64-$R_{UNIT}$ R_LADDER, and the feedback voltage 0 $V_{FB0}$ may be input to the inverting terminal of the first operational amplifier OP1. The feedback voltage 0 $V_{FB0}$ is controlled to be equal to the source voltage Vsrc input to the non-inverting terminal of the first operational amplifier OP1, so that a negative feedback is applied to the first operational amplifier OP1. The first driving unit 620 may provide the first node node1 with the second voltage V2 that is higher than the ground voltage VSS and is lower than the power voltage VDD.

Thus, the voltage of the first node node1 is the second voltage V2, and the voltage of the second node node2 is the ground voltage VSS.

The ladder resistor 64-$R_{UNIT}$ R_LADDER and the multiplexer 650 are coupled to each other, and the number of unit resistors included in the first dividing resistor x-$R_{UNIT}$ at the upper side of the ladder resistor 64-$R_{UNIT}$ R_LADDER and the second dividing resistor y-$R_{UNIT}$ at the lower side of the ladder resistor 64-$R_{UNIT}$ R_LADDER may be adjusted according to the third mode control signal.

According to the third mode control signal, the first dividing resistor x-$R_{UNIT}$ has resistance values corresponding to 57 unit resistors (7+21+29). The second dividing resistor y-$R_{UNIT}$ has resistance values corresponding to 20 unit resistors. The ladder resistor 64-$R_{UNIT}$ R_LADDER may generate a plurality of reference voltages Vres[63:0] by dividing, in a voltage dividing manner, the difference between the voltage of the third node node3 and the voltage of the fourth node node4, which are determined by the first dividing resistor x-$R_{UNIT}$ having the resistance values corresponding to 57 unit resistors and the second dividing resistor y-$R_{UNIT}$ having the resistance values corresponding to 20 unit resistors.

Figure 10:
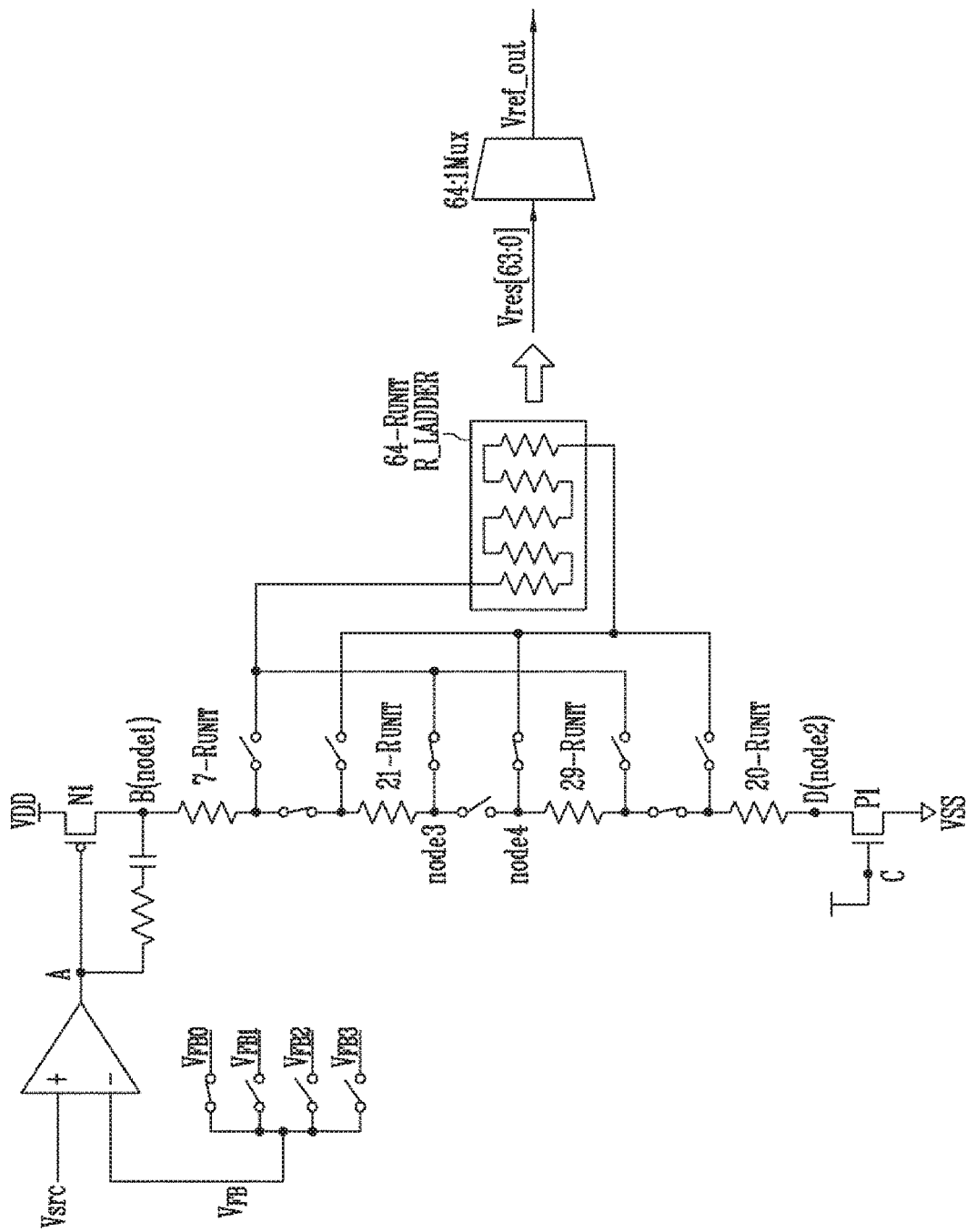
FIG. 10 is a diagram illustrating an exemplary operation of the reference voltage generating unit that generates a reference voltage under a fourth range of the second protocol condition.

FIG. 10 is a diagram illustrating an exemplary operation of the reference voltage generating unit that generates a reference voltage under the fourth range of the second protocol condition.

Referring to FIGS. 6 and 10, the fourth mode control signal may be input to generate a reference voltage under the fourth range of the second protocol condition. The second driving unit 630 may transfer the ground voltage VSS to the second node node2 according to the fourth mode control signal. Specifically, a driving signal corresponding to "0" may be input to the inverting terminal of the second operational amplifier OP2 such that the output of the second operational amplifier OP2 becomes "1."

In addition, the first driving unit 620 may receive feedback voltage 2 $V_{FB2}$ input from the ladder resistor 64-$R_{UNIT}$ R_LADDER, and the feedback voltage 2 $V_{FB2}$ may be input to the inverting terminal of the first operational amplifier OP1. The feedback voltage 2 $V_{FB2}$ is controlled to be equal to the source voltage Vsrc input to the non-inverting terminal of the first operational amplifier OP1, so that a negative feedback is applied to the first operational amplifier OP1. The first driving unit 620 may provide the first node node1 with the second voltage V2 that is higher than the ground voltage VSS and is lower than the power voltage VDD.

Thus, the voltage of the first node node1 is the second voltage V2, and the voltage of the second node node2 is the ground voltage VSS.

The ladder resistor 64-$R_{UNIT}$ R_LADDER and the multiplexer 650 are coupled to each other, and the number of unit resistors included in the first dividing resistor x-$R_{UNIT}$ at the upper side of the ladder resistor 64-$R_{UNIT}$ R_LADDER and the second dividing resistor y-$R_{UNIT}$ at the lower side of the ladder resistor 64-$R_{UNIT}$ R_LADDER may be adjusted according to the fourth mode control signal.

According to the fourth mode control signal, the first dividing resistor x-$R_{UNIT}$ has resistance values corresponding to 28 unit resistors (7+21). The second dividing resistor y-$R_{UNIT}$ has resistance values corresponding to 49 unit resistors (29+20). The ladder resistor 64-$R_{UNIT}$ R_LADDER may generate a plurality of reference voltages Vres[63:0] by dividing, in a voltage dividing manner, the difference between the voltage of the third node node3 and the voltage of the fourth node node4, which are determined by the first dividing resistor x-$R_{UNIT}$ having the resistance values corresponding to 28 unit resistors and the second dividing resistor y-$R_{UNIT}$ having the resistance values corresponding to 49 unit resistors.

Based on the circuit configurations of FIGS. 6 to 10, all unit resistors included in the reference voltage generating unit may be used. In addition, it is possible to generate reference voltages that satisfy different protocol conditions.

According to the present disclosure, it is possible to provide a semiconductor controller having improved scalability, a storage device including the semiconductor controller, and an operating method of the storage device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A reference voltage generating circuit comprising:
a first driving unit coupled between a power voltage and a first node;
a second driving unit coupled between a second node and a ground voltage;
a voltage generating unit coupled in series between the first node and the second node and configured to output a plurality of reference voltages; and
an operation setting unit configured to set a control signal input to the first driving unit and the second driving unit according to an operation mode,
wherein the operation mode is determined based on a target voltage level range corresponding to the plurality of reference voltages, among a plurality of voltage level ranges defined under a first protocol condition and a second protocol condition.

2. The reference voltage generating circuit of claim 1, further comprising a multiplexer configured to select, as an output reference voltage, any one reference voltage among the plurality of reference voltages.

3. The reference voltage generating circuit of claim 1, wherein the voltage generating unit comprising:
a first dividing resistor coupled to the first node;
a second dividing resistor coupled to the second node; and
a ladder resistor coupled between the first dividing resistor and the second dividing resistor,
wherein the ladder resistor value is determined based on the control signal.

4. The reference voltage generating circuit of claim 3, wherein the control signal is any one of a first mode control signal corresponding to a first range in the voltage level range defined under the first protocol condition, a second mode control signal corresponding to a second range in the voltage level range defined under the first protocol condition, a third mode control signal corresponding to a third range in the voltage level range defined under the second protocol condition, and a fourth mode control signal corresponding to a fourth range in the voltage level range defined under the second protocol condition.

5. The reference voltage generating circuit of claim 4, wherein the first driving unit provides the power voltage to the first node in response to the first mode control signal or the second mode control signal, and
the second driving unit provides the second node with a first voltage that is higher than the ground voltage and is lower than the power voltage, in response to the first mode control signal or the second mode control signal.

6. The reference voltage generating circuit of claim 5, wherein the first driving unit comprising:
a first operational amplifier configured to receive a source voltage input to a non-inverting terminal thereof, and receive a driving signal input to an inverting terminal thereof in response to the first mode control signal or the second mode control signal; and
a first switch configured to receive an output of the first operational amplifier, which is input to a gate electrode thereof, and allow the power voltage and the first node to be coupled to each other according to the output of the first operational amplifier.

7. The reference voltage generating circuit of claim 6, wherein the second driving unit comprising:
a second operational amplifier configured to receive the source voltage input to a non-inverting terminal thereof, and receive a feedback voltage output from the ladder resistor, which is input to an inverting terminal thereof, in response to the first mode control signal or the second mode control signal; and
a second switch configured to receive an output of the second operational amplifier, which is input to a gate electrode thereof, and provide the first voltage to the second node according to the output of the second operational amplifier.

8. The reference voltage generating circuit of claim 4, wherein the first driving unit provides the first node with a second voltage that is lower than the power voltage and is higher than the ground voltage, in response to the third mode control signal or the fourth mode control signal, and
the second driving unit provides the ground voltage to the second node in response to the third mode control signal or the fourth mode control signal.

9. The reference voltage generating circuit of claim 8, wherein the first driving unit comprising:
a first operational amplifier configured to receive a source voltage input to a non-inverting terminal thereof, and receive a feedback voltage output from the ladder resistor, which is input to an inverting terminal thereof, in response to the third mode control signal or the fourth mode control signal; and
a first switch configured to receive an output of the first operational amplifier, which is input to a gate electrode thereof, and provide the second voltage to the first node according to the output of the first operational amplifier.

10. The reference voltage generating circuit of claim 9, wherein the second driving unit comprising:
a second operational amplifier configured to receive the source voltage input to a non-inverting terminal thereof, and receive a driving signal input to an inverting terminal thereof in response to the third mode control signal or the fourth mode control signal; and a second switch configured to receive an output of the second operational amplifier, which is input to a gate electrode thereof, and allow the second node and the ground voltage to be coupled to each other according to the output of the second operational amplifier.

11. A memory controller for controlling a memory device, the memory controller comprising:
   an input buffer configured to receive an input voltage of a data signal from the memory device, and to store the data signal based on a comparison result between the input voltage and a reference voltage; and
   a reference voltage control unit configured to check a voltage level range of the input voltage, and to generate the reference voltage corresponding the voltage level range of the input voltage.

12. The memory controller of claim 11, wherein the input buffer is configured to receive the input voltage of the data signal from the memory device, when data stored in the memory device is read by the memory controller,
   wherein the data signal corresponds to the data.

13. The memory controller of claim 11, wherein the reference voltage control unit is configured to compare the voltage level range of the input voltage with a plurality of voltage level ranges defined under a plurality of protocol conditions.

14. The memory controller of claim 13, wherein the reference voltage control unit is configured to determine a target voltage level range including the voltage level range of the input voltage, among the plurality of voltage level ranges, and to generate the reference voltage corresponding to the target voltage level range.

\* \* \* \* \*